United States Patent
Lany et al.

(10) Patent No.: US 8,067,953 B2
(45) Date of Patent: Nov. 29, 2011

(54) SEMICONDUCTOR DEVICE FOR MEASURING ULTRA SMALL ELECTRICAL CURRENTS AND SMALL VOLTAGES

(75) Inventors: Marc Lany, Lausanne (CH); Radivoje Popovic, St-Sulpice (CH)

(73) Assignee: Ecole Polytechnique Federale De Lausanne, Lausanne (CH)

( * ) Notice: Subject to any disclaimer, the term of this patent is extended or adjusted under 35 U.S.C. 154(b) by 334 days.

(21) Appl. No.: 12/520,862

(22) PCT Filed: Dec. 17, 2007

(86) PCT No.: PCT/EP2007/064100
§ 371 (c)(1),
(2), (4) Date: Jun. 22, 2009

(87) PCT Pub. No.: WO2008/074789
PCT Pub. Date: Jun. 26, 2008

(65) Prior Publication Data
US 2010/0013458 A1   Jan. 21, 2010

(30) Foreign Application Priority Data
Dec. 20, 2006   (EP) .................................... 06126681

(51) Int. Cl.
*G01R 31/02* (2006.01)
*G01R 1/30* (2006.01)
(52) U.S. Cl. ............................... 324/762.08; 324/123 R
(58) Field of Classification Search .............. 324/123 R, 324/762.08
See application file for complete search history.

(56) References Cited

U.S. PATENT DOCUMENTS 2,843,515 A    7/1958 Statz et al.
2,850,699 A *  9/1958 Davidson et al. ........ 324/762.08
(Continued)

FOREIGN PATENT DOCUMENTS

CH    683577    3/1994
(Continued)

OTHER PUBLICATIONS

Kao, Y.C. et al., "High-Voltage Planar p-n Junctions", Proceedings of the IEEE, vol. 55, No. 8, pp. 1409-1414, Aug. 1967.
(Continued)

*Primary Examiner* — Huy Q Phan
*Assistant Examiner* — Joshua Benitez
(74) *Attorney, Agent, or Firm* — Nixon Peabody LLP (57) ABSTRACT

A semiconductor device for measuring ultra low currents down to the level of single electrons or low voltages comprises a first and a second voltage supply terminal, an input terminal for receiving an electrical current or being supplied with a voltage to be measured, a bipolar transistor having a base, an emitter and a collector, wherein a first PN junction is formed between the base and the collector and a second PN junction is formed between the base and the emitter, wherein the emitter is coupled to the input terminal and the base is coupled to the second voltage supply terminal, and wherein the first PN junction is designed for reverse biased operation as an avalanche diode, and a quenching and recharging circuit having a first terminal coupled to the first voltage supply terminal and a second terminal coupled to the collector of the bipolar transistors, the quenching and recharging circuit permitting operation of the first PN junction reverse biased above the breakdown voltage of the first PN junction.

28 Claims, 4 Drawing Sheets

U.S. PATENT DOCUMENTS

| | | | | |
|---|---|---|---|---|
| 3,223,854 | A | * 12/1965 | Hansen et al. | 327/580 |
| 4,370,615 | A | 1/1983 | Whistler et al. | |
| 4,804,909 | A | 2/1989 | Fink | |
| 5,933,042 | A | * 8/1999 | Trottier et al. | 327/326 |
| 5,945,868 | A | * 8/1999 | Robb et al. | 327/482 |
| 6,376,321 | B1 | 4/2002 | Popovic et al. | |
| 7,605,598 | B2 | * 10/2009 | Kelly | 324/762.09 |
| 2006/0081874 | A1 | 4/2006 | Francis et al. | |

FOREIGN PATENT DOCUMENTS

| | | |
|---|---|---|
| EP | 1 679 749 | 7/2006 |
| WO | 2005/101194 | 10/2005 |

OTHER PUBLICATIONS

Bylander, J. et al., "Current Measurement By Real-Time Counting Of Single Electrons", Nature, vol. 434, pp. 361-364, Mar. 17, 2005.

* cited by examiner

Fig. 9

SEMICONDUCTOR DEVICE FOR MEASURING ULTRA SMALL ELECTRICAL CURRENTS AND SMALL VOLTAGES

CROSS REFERENCE TO RELATED APPLICATIONS

The present application is related to and claims priority based upon PCT Patent Application No. PCT/EP2007/064100 entitled "Semiconductor Device For Measuring Ultra Small Electrical Currents And Small Voltages", filed Dec. 17, 2007, which, in turn, claims priority from European Patent Application No. 06126681.3, filed on Dec. 20, 2006, the disclosure of both of which is hereby incorporated herein by reference.

TECHNICAL FIELD

The present invention is directed to a semiconductor device for measuring ultra-small electrical currents down to the level of measuring even single electrical charge carriers and for measuring small voltages.

BACKGROUND OF THE INVENTION

Conventional current measurements involve measuring the voltage drop across a resistor. With this measurement technique, single electrical charge carriers cannot be detected because their signals disappear in the noise.

Low current measurement by electron counting has already been achieved at cryogenic temperature using a one dimensional series array of tunnel junctions combined with a radio-frequency single-electron transistor, as described in the paper by J. Bylander, T. Duty and P. Delsing, entitled "Current measurement by real-time counting of single electrons", published in Nature, 434, pp. 361-363 (London, 2005). However, the need for cryogenic temperatures makes this method unpractical.

U.S. Pat. No. 4,370,615 discloses a high-impedance, fast electrometer for measuring small currents.

It is known to use avalanche transistor circuits to generate fast pulses with short rise or fall times and large amplitudes exceeding 10 V. U.S. Pat. No. 3,223,854 discloses such a circuit that decreases the recovery time without decreasing the amplitude of the output pulse of the avalanche transistor circuit thereby increasing the repetition rate at which such circuits can be operated. The circuit is an improvement over the conventional common emitter avalanche transistor circuit for pulse generation. These applications require that the avalanche transistor be of a relatively large size.

European Patent No. EP 1679749 discloses a photodiode using the avalanche effect that is capable of detecting single photons. The photodiode comprises a quenching and recharging circuit allowing its operation in the Geiger mode.

BRIEF DESCRIPTION OF THE INVENTION

An object of the invention is to develop a semiconductor device for detecting and measuring very small currents or even single electrical charge carriers.

The invention comprises a completely novel semiconductor device that is capable of measuring very small currents or even single electrons and also very small voltage variations. The novel semiconductor device comprises a first and a second voltage supply terminal, an input terminal, a bipolar transistor having a base, an emitter and a collector, wherein a first PN junction is formed between the base and the collector and a second PN junction is formed between the base and the emitter, wherein the emitter is coupled to the input terminal and the base is coupled to the second voltage supply terminal, and wherein the first PN junction is designed for reverse-biased operation as an avalanche diode, and a quenching and recharging circuit having a first terminal coupled to the first voltage supply terminal and a second terminal coupled to the collector of the bipolar transistor, the quenching and recharging circuit configured to permit operation of the first PN junction reverse-biased above the breakdown voltage of the first PN junction.

According to the invention the novel semiconductor device is operated in a novel manner, namely, the first PN junction is reverse-biased above its breakdown voltage.

The bipolar transistor is a three-layer semiconductor NPN or PNP structure wherein N and P denote p-type material and n-type material, respectively. The second voltage supply terminal may be connected to ground or to an arbitrary constant reference voltage. If a current is to be measured, then it is fed to the input terminal. If a voltage is to be measured, then it is applied to the input terminal and the second voltage supply terminal or another terminal providing a constant reference voltage. The semiconductor device may be further used to detect any single electron that reaches the input terminal, if it crosses the emitter-base junction and reaches the base-collector junction.

The structure of the bipolar transistor is optimized so that:
a) the first PN junction may be operated as an avalanche diode;
b) the first PN junction has a breakdown voltage higher than a predetermined value (which is 15 V for silicon semiconductor material) in order to ensure the breakdown is due to the avalanche effect and not to band-to-band tunneling as it is the case for highly-doped junctions with low breakdown voltages;
c) the leakage current of the first PN junction is less than $10^{-15}$ A; and
d) the probability is high that an electrical charge carrier that crosses the emitter-base junction reaches the depletion region of the first PN junction.

The term "avalanche diode" is widely known and means a diode formed as a PN junction between p-type semiconductor material and n-type semiconductor material and operated biased with a reverse voltage for making use of the avalanche effect. The avalanche effect occurs when a single free charge carrier reaching the high electrical field region of the PN junction acquires a sufficiently high kinetic energy to create an electron-hole pair by impact ionization. The free carriers created thereby also accelerate in the strong electrical field and cause the creation of more electron-hole pairs which undergo the same multiplication process. The result of the avalanche effect is that a free carrier reaching the depletion region of the avalanche diode produces a lot of electrons and holes which result in a strong current pulse that can easily be measured. In order to achieve high gain, the avalanche diode is operated with a high reverse-bias voltage. However, the gain may be further increased if the avalanche diode is operated in the Geiger mode. In this mode the avalanche diode is reverse-biased above the breakdown voltage. Any triggered avalanche effect leads to an increasing avalanche current that is maintained as long as the bias voltage stays above the breakdown voltage. The quenching and recharging circuit serves to stop the avalanche effect after a certain time delay so that the semiconductor device is ready to detect a next free carrier. The quenching and recharging circuit may be a passive circuit including, for example, a resistor. The avalanche current discharges the diode capacitance because it is much larger than the current allowed to flow through the quenching resistor, and thus lowers the bias voltage of the PN junction until the avalanche effect stops. As soon as the avalanche current stops, the reverse-bias across the PN junction increases again until it reaches the level of the supply voltage. The quenching and recharging circuit may also be an active circuit that achieves the same functions with active components.

The result of this process is a short current pulse crossing the base-collector junction. It may be detected as a voltage drop at the node between the collector of the bipolar transistor and the quenching and recharging circuit. The detection of this voltage drop is straightforward and therefore the output terminal is preferably connected to this node. Every triggered avalanche effect produces a voltage drop at this node and looks like a voltage pulse that may be further processed. It may be fed for example to a counter. However, the avalanche current could also be detected in another way, e.g., as an increase in the current flowing through the quenching and recharging circuit.

The following design rules are preferably applied to assure that the first PN junction when reverse biased exhibits a useful form of the avalanche effect:
a) the maximum of the electrical field in the first PN junction should be located in the bulk of the semiconductor;
b) the maximum of the electrical field in the first PN junction should be constant over a substantial part of the PN junction area; and
c) the maximum of the electrical field should be at least 10% greater than the field at the periphery of the PN junction.
If these design rules are maintained then it is possible to achieve over a substantial part of the base-collector junction a uniform and high probability for a carrier reaching the depletion region to initiate an avalanche effect.

In the Geiger mode the first PN junction is an intrinsically unstable state. This means that any electron (including an electron generated by a photon) that reaches the depletion region of the first PN junction may trigger an avalanche effect. Such an electron may be, for example, a thermally excited electron that is created somewhere in the semiconductor device. Such electrons are measured as parasitic current. In order to keep the parasitic current at a minimum, the first PN junction should be small and preferably the area occupied by the first PN junction as measured at the surface of the semiconductor device should be below 1000 $\mu m^2$.

The following design rules are preferably applied to achieve an optimal structure for the bipolar transistor:
a) the area of the second PN junction, i.e., the emitter-base junction, is smaller than the area of the first PN junction area;
b) the depletion regions of the first and second PN junctions should not touch each other when the first PN junction is biased for operation in the Geiger mode, in order to prevent emitter-collector punch through;
c) the maximum of the electrical field in the first PN junction should be uniform and at a constant distance from the second PN junction; and
d) the maximum of the electrical field in the first PN junction should be located as close as possible to the second PN junction—this may be achieved by using a guard ring structure that avoids locating the maximum of the electrical field in the first PN junction at the periphery, as it would occur if no precautions are taken—due to surface defects and the so called "peak-effect" which produces an increased electrical field at the edge where the radius of curvature is smaller.

The bipolar transistor of the novel semiconductor device has some characteristics common with avalanche transistors known in the prior art, i.e., they are both 3-terminal NPN or PNP semiconductor structures and have means, such as guard-rings, to avoid the collector-base breakdown at the periphery of the collector-base junction and their operation involves the avalanche mechanism. However, there are some important differences, e.g., the size of the bipolar transistor of the present invention is very small compared to the large size of an avalanche transistor of the prior art, the collector-base junction is operated in the Geiger mode whereas conventional avalanche transistors are operated below the breakdown voltage, with the present invention the emitter of the bipolar transistor is the control or sensing electrode whereas in conventional avalanche transistors the base is the controlling electrode, and avalanche transistors of the prior art are mainly used as electrical actuators or as switching elements to create strong current pulses.

The novel semiconductor device has also some characteristics in common with so-called Single Photon Avalanche Photo-Diodes, i.e., both devices comprise a quenching and recharging circuit permitting operation in the Geiger mode. However, Single Photon Avalanche Photo-Diodes cannot measure currents or voltages.

BRIEF DESCRIPTION OF THE FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
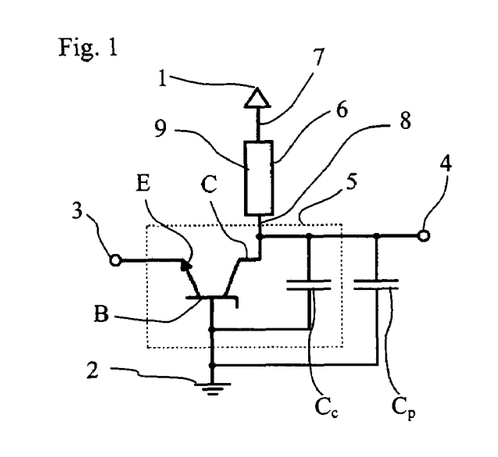
FIG. 1 is an electrical schematic diagram showing a circuit diagram of a semiconductor device according to an embodiment of the present invention.

FIG. 1 shows a circuit diagram of the semiconductor device according to a first embodiment of the invention. The semiconductor device has a first voltage supply terminal 1, a second voltage supply terminal 2, an input terminal 3 and an output terminal 4. The semiconductor device comprises a bipolar transistor 5 having a base B, an emitter E and a collector C, and a quenching and recharging circuit 6. The emitter E is directly connected to the input terminal 3, the collector C is directly connected to the output terminal 4 and the base B is connected to the second voltage supply terminal 2. The quenching and recharging circuit 6 is a passive circuit having a first terminal 7 connected to the first supply voltage terminal 1 and a second terminal 8 connected to the collector C. In the present embodiment the quenching and recharging circuit 6 is an ohmic resistor 9. The capacitances $C_c$ and $C_p$ are not real capacitors but inherently present capacitances. Their influence on the properties of the semiconductor device will be explained later. In operation, the second voltage supply terminal 2 is connected to a constant reference voltage, e.g., to ground, and a voltage $V_{cc}$ of typically 20 to 60 V, with respect to the reference voltage is applied to the first voltage supply terminal 1.

Figure 2:
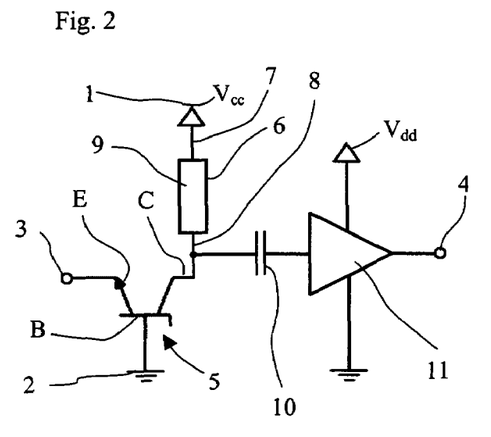
FIG. 2 is an electrical schematic diagram showing a circuit diagram of a semiconductor device according to an embodiment of the present invention that is coupled to a buffer.

FIG. 2 shows the semiconductor device of FIG. 1 with which the output terminal 4 is coupled directly or as shown via a coupling capacitor 10 to the input terminal of a buffer 11. The base B of the bipolar transistor 5 is connected to ground. The buffer 11 may be any electronic component such as an operational amplifier or a comparator that has a high input impedance (i.e., a high input resistance and a low input capacitance) and a low output impedance. The coupling capacitor removes the high DC component of the output voltage that could exceed the input limit of the buffer 11. The need for a coupling capacitor depends on the biasing of the semiconductor device with respect to the buffer electronics.

Figure 3:
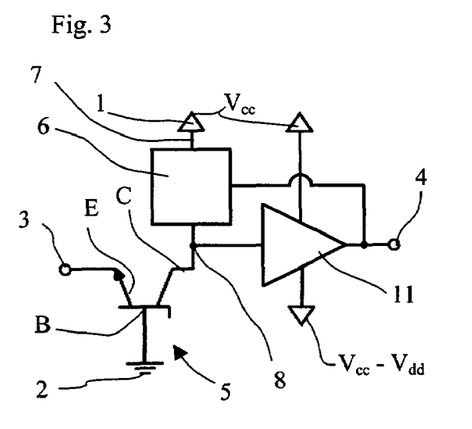
FIG. 3 is an electrical schematic diagram showing a circuit diagram of a semiconductor device according to an embodiment of the present invention that comprises a buffer and an active quenching and recharging circuit.

FIG. 3 shows an embodiment of the semiconductor device of FIG. 1 in which the resistor forming a passive quenching and recharging circuit 6 of FIG. 1 has been replaced by an active quenching and recharging circuit that comprises active components and that uses feedback for actively lowering the reverse bias voltage across the first PN junction during the quenching phase and/or for recharging the first PN junction once the quenching of the avalanche current has occurred. The active quenching and recharging circuit comprises at least a MOSFET or a bipolar transistor. It can be designed to perform the one or more of different functions, including:
a) actively lowering the reverse bias voltage applied to the base-collector junction below the breakdown voltage once the avalanche current exceeds a predefined threshold and actively increasing the reverse bias voltage applied to the base-collector junction back to its initial value once the avalanche current has dropped below a predefined threshold;
b) increasing the reverse bias voltage applied to the base-collector junction with a fixed delay that is longer than the quenching time after the detection of an avalanche current that exceeds a given threshold;
c) increasing the reverse bias voltage applied to the base-collector junction with a fixed delay that is longer than the quenching time after the avalanche current has dropped below a predefined threshold; and
d) reducing the impedance between the collector C and the first voltage supply terminal 1 once the avalanche current has dropped below a given threshold.

With this example the buffer 11 is biased between $V_{cc}$ and $V_{cc}-V_{dd}$, where $V_{dd}$ designates the supply voltage for the standard electronics (typically 3.3V for a contemporary 0.35 μm CMOS technology, in opposition to the relatively high voltage of 20 to 60 V needed for the first PN junction where the avalanche effect has to occur). So there is no big DC voltage difference between the collector C of the bipolar transistor 5 and the input transistors of the buffer 11.

The buffer 11 serves to bring the voltage appearing at the collector C of the bipolar transistor 5 to an external circuit without disturbing the Geiger mode operation.

Returning to FIG. 1 the operation of the semiconductor device is explained for the case that the bipolar transistor 5 is an NPN transistor. A first PN junction is formed between the collector C and the base B of the bipolar transistor 5. Subsequently it is referred to as the collector-base junction. A second PN junction is formed between the emitter E and the base B of the bipolar transistor 5 which is referred to as the emitter-base junction. The base B of the bipolar transistor 5 is connected to ground GND or another stable DC reference voltage. A positive DC voltage $V_{cc}$ is applied to the first voltage supply terminal 1. The DC voltage $V_{cc}$ is higher by a few volts than the breakdown voltage $V_b$ of the collector-base junction. $V_{cc}$ and $V_b$ may for example have the values $V_{cc}$=55V and $V_b$=50V. Typically, $V_{cc}$ is 1% to 20% higher than $V_b$. Assuming that the input current that is fed to the emitter E at first is zero, if the leakage current of the collector-base junction can be neglected, then no current will flow through the resistor 9. Consequently, the output voltage $V_{out}$ appearing at the output terminal 4 is $V_{out}=V_{cc}$ and the collector-base junction will be reverse biased with the supply voltage $V_{cc}$. Accordingly, the electrical charge $Q_{cc}=V_{cc}(C_c+C_p)$ is stored in the capacitances $C_c$ and $C_p$ wherein $C_c$ denotes the inherent capacitance of the base-collector junction and $C_p$ denotes the external parasitic capacitance lying parallel to the capacitance $C_c$. If now a negative voltage is applied to the emitter E, then the emitter-base junction will become forward biased and therefore a current $I_{in}$ will flow into the emitter E. A part of (and if possible most of) this current comprises electrons flowing from the emitter E into the base B. So the emitter E serves to inject electrons to the base B, much as in the case of a conventional bipolar transistor. However, to operate, a conventional bipolar transistor needs a substantial emitter current, typically above 1 nA ($10^{-9}$ A). On the contrary, the bipolar transistor 5 can operate with much smaller emitter currents, in the range of a femto-ampere ($10^{-15}$ A). Because of this small value, the emitter current can be regarded as a flow of individual electrons that pass through the emitter E. The electrons injected from the emitter E into the base region move toward the base-collector junction. Assuming that at least one of such electrons arrives, without recombining with a hole, at the high-electrical-field region of the collector-base junction, then this electron will be accelerated by the strong electrical field, and, with a high probability $P_a$, will produce an avalanche current $I_a$. Typically, the probability is $P_a$>0.5. The avalanche current $I_a$ will start to discharge the capacitors $C_c$ and $C_p$. Under the condition that the recharging current $I_c$ flowing through the resistor 9 is small, i.e., <<$I_a$, the electrical charge at $C_c$ and $C_p$ decreases and the output voltage $V_{out}$ also decreases. Once the output voltage $V_{out}$ over the collector-base junction has dropped to about the breakdown voltage $V_b$, the avalanche is not self-sustainable, and the avalanche stops with the avalanche current $I_a$ falling to zero. Afterwards the capacitances $C_c$ and $C_p$ are recharged by the current $I_c$, and the output voltage $V_{out}$ increases again and reaches the value $V_{cc}$. When the next electron emitted by the emitter reaches the collector-base junction, the same process will start again.

Figure 4:
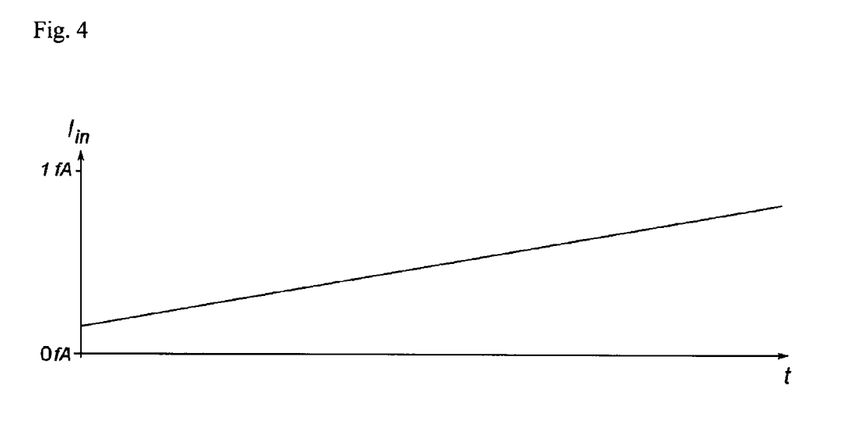
FIGS. 4 and 5 are, respectively, a plot of current versus time for a current to be measured and a corresponding plot of voltage versus time for an output of a semiconductor device according to an embodiment of the present invention.
Figure 5:
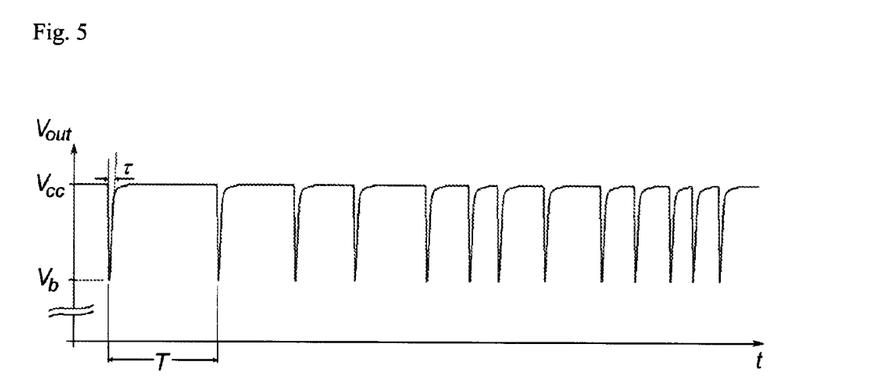

FIGS. 4 and 5 illustrate a consequence of this process. FIG. 4 shows the input current $I_{in}$, fed to the emitter E. In this example the input current $I_{in}$, increases linearly with time t and lies in the range of about 1 fA. FIG. 5 shows the output voltage $V_{out}$. The base line of $V_{out}$ is the supply voltage $V_{cc}$. From time to time, $V_{out}$ quickly drops to about $V_b$, and then, with a time constant τ, returns back to $V_{cc}$. The average rate <1/T> of the pulses of $V_{out}$ is proportional to the input current $I_{in}$: <1/T>=$F_s * I_{in}$, if the leakage current or parasitic pulses, respectively, can be neglected. Here T denotes the period of time between the pulses of $V_{out}$, and $F_s$ is a proportionality factor in units of Hz/A. So, the output signal of the semiconductor device is a series of pulses the frequency of which depends upon the current fed to the input terminal 3 or the voltage applied to the input terminal 3, respectively. The series of pulses may be converted into a digital number by feeding the series of pulses to a digital counter.

In order that the avalanche current $I_a$ may discharge the capacitances $C_c$ and $C_p$, the current $I_c$ flowing through the resistor 9 of the quenching and recharging circuit should be small compared to the avalanche current $I_a$. The peak value of the avalanche current $I_a$ typically amounts to about 1 mA, so the maximum of the current $I_c$ should be $I_c$<0.1 mA. For an excess voltage $V_e = V_{cc} - V_b = 5V$, where $V_{cc}$ denotes the voltage supplied to the first voltage supply terminal 1 and $V_b$ denotes the breakdown voltage of the first PN junction (i.e., the collector-base junction), the resistance $R_q$ of the resistor 9 should be $R_q > 50$ kΩ.

A leakage current $I_{co}$ of the collector-base junction produces parasitic pulses in $V_{out}$, which are not correlated with the input current $I_{in}$. This leakage current $I_{co}$ shows up as an equivalent offset and noise in the measurement of $I_{in}$, and, therefore, is highly undesirable. For good operation of the bipolar transistor 5 the average frequency of the parasitic pulses $F_p$ should be below a certain frequency, e.g., $F_p < 1$ kHz. In the ideal case the probability $P_a$ that an electron reaching the depletion region of the collector-base junction initiates an avalanche process is $P_a = 1$. Then the leakage current $I_{co}$ will produce pulses in $V_{out}$ with the average rate $F_p = I_{co}/q$, where q denotes the electron charge. So the leakage current $I_{co}$ should be $$I_{co} < F_p/q = 1.6 \times 10^{-16} A \quad (1).$$

This imposes some particular requirements for the properties of the bipolar transistor 5, which are described below.

The maximum pulse rate of the novel semiconductor device is denoted by $F_m$. To be useful in technical applications, the novel semiconductor device should allow a large dynamic range $F_d = F_m - F_p$. If $F_m >> F_p$, then $F_d \approx F_m$. From FIG. 5 it can be seen that $F_m$ should be small compared to the inverse of the time constant $\tau$: $F_m << 1/\tau$. The time constant $\tau$ is given by $$\tau = R_q * (C_c + C_p) \quad (2).$$

Accordingly, $$R_q * (C_c + C_p) << 1/F_m \quad (3).$$

If an application requires $F_m = 100$ MHz then the duration of the pulses will be about $T_{min} = 10$ ns. In the ideal case, the parasitic capacitance $C_p$ is small compared to the collector-base capacitance $C_c$: $C_p << C_c$ and can be neglected. This sets the limit for the time constant $\tau$ of a passive quenching and recharging circuit to $R_q * C_c << 10$ ns. A reasonable value for the resistor 9 is R=100 kΩ. This leads to the requirement that the collector-base capacitance $C_c$ should fulfill $$C_c << 0.1 pF \quad (4).$$

Figure 6:
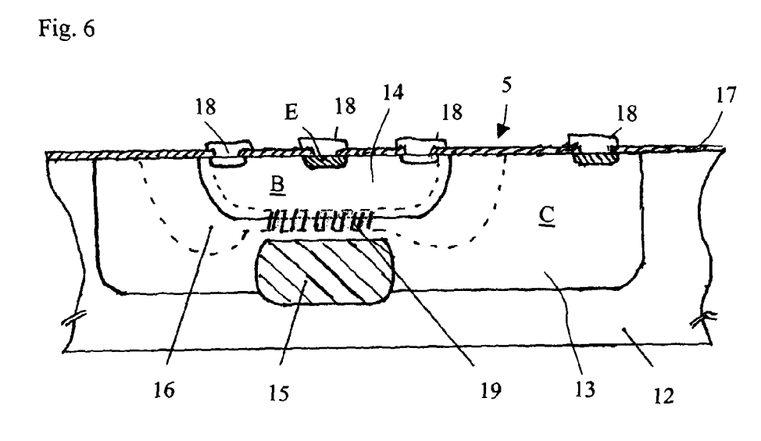
FIGS. 6 to 8 are cross-sectional drawings illustrating various embodiments of semiconductor devices in accordance with the present invention.
Figure 7:
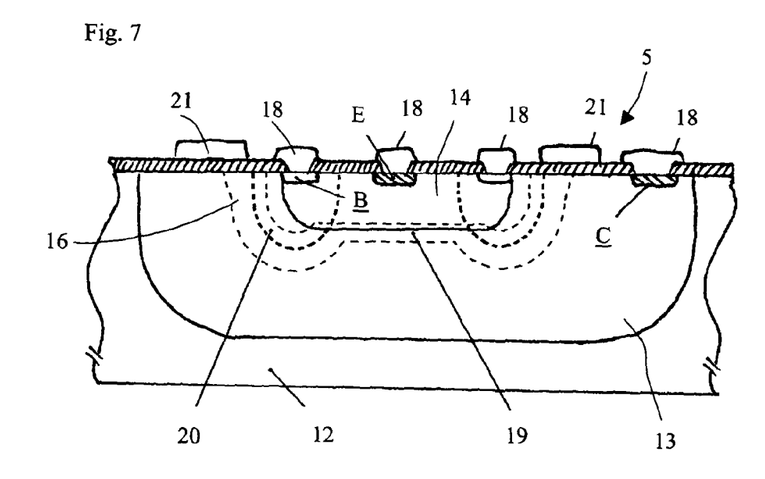
Figure 8:
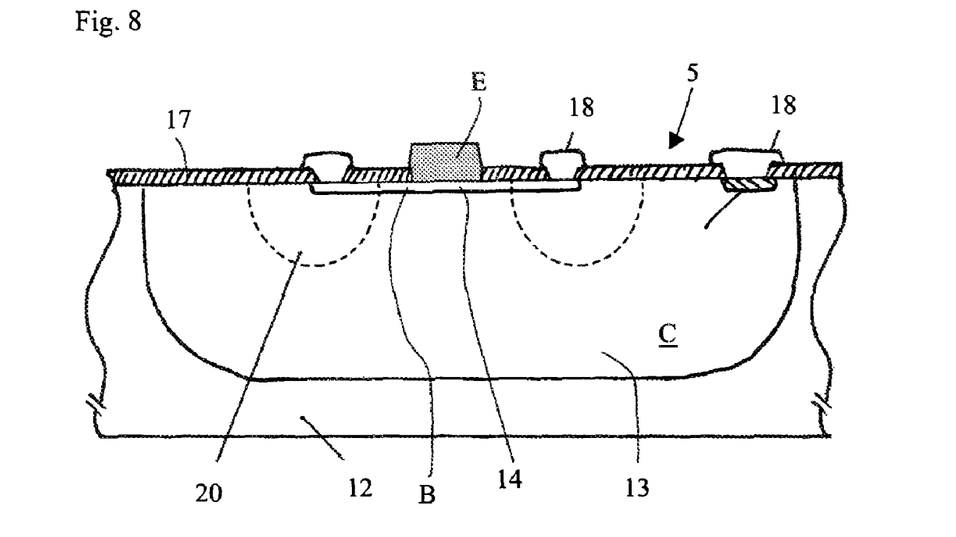

The structure of the bipolar transistor 5 according to the invention is a semiconductor NPN or PNP structure like the structure of a conventional integrated bipolar transistor. It has a high doping in the emitter region, has high-doped regions at the contact areas and is insulated from the substrate and neighboring devices. It may be realized using different conventional integrated circuit technologies, including CMOS, bipolar, hetero-junction, and hybrid $I_c$ technologies. However, in order to permit the operation as described above, the structure of the bipolar transistor 5 has the following specific features:

a) The base-collector junction is designed so that the maximum of the electrical field appears very close to the emitter-base junction. Preferably, the maximum field region of the base-collector junction is situated just under the emitter region. This can be achieved in different ways such as:
1) Increasing the doping or the doping gradient in the collector region just under the emitter. This can be achieved by using a buried layer. An example is shown in FIG. 6.
2) Decreasing the doping or the doping gradient in the region of the collector C which is not under the emitter E, particularly at the periphery of the base-collector junction and/or by increasing the curvature radius of the base-collector junction. This can be achieved by use of different techniques which may be combined, e.g.:
    A) a diffused guard ring (examples are shown in FIGS. 7 and 8), as described for example in the article "High-voltage planar p-n junctions" of the authors Y. C. Kao and E. D. Wolley which was published in the proceedings of the IEEE, Vol. 55, No. 8, August 1967;
    B) forming at least the base-collector junction as a hemispherical junction as described for example in the international patent application publication WO 2006/074990;
    C) adding surface or lateral field plates, as described for example in the international patent application publication WO 2006/074990 (An example of a surface field plate is shown in FIG. 7);
    D) using starved source diffusion as described in the U.S. Patent Application publication US 2006-081874; and
    E) using lateral diffusion to form the collector C as described in the U.S. Pat. No. 6,376,321.

The techniques listed above under 1) and 2) may be combined.

b) The total area of the bipolar transistor 5 is preferably as small as possible. The semiconductor device of the invention operates with very small energy pulses, so there is no need for increasing its size because of the power dissipation. The criteria on how small the bipolar transistor 5 should be for successful operation in the Geiger mode can be estimated as follows:
1) It is desirable to minimize the capacitance $C_c$ of the collector C. For a reasonable collector doping density of about $3 \times 10^{16}$ cm$^{-3}$ and operation of the collector C at a voltage of about 50V, the junction capacitance per unit area is about $10^4$ pF/cm$^2$. According to Eq. (3), the capacitance of the base-collector junction should be as small as possible, say $C_c << 0.1$ pF. Therefore, the area $A_c$ of the base-collector junction should be much smaller than $10^{-5}$ cm$^2$, resulting in a diameter $D_c$ of a circular base-collector junction of $$D_c << 30 \mu m \quad (5).$$

2) The quenching and recharging circuit and the output buffer 11 should preferably be integrated on the same semiconductor chip as the bipolar transistor 5, because otherwise the parasitic capacitance $C_p$ could severely deteriorate the performance of the semiconductor device of the invention.
3) The capacitance $C_p$ includes the capacitance between the collector and the substrate. Therefore the collector to substrate junction area and capacitance per unit area should be minimized.

It is believed that the collector doping density could be as high as about $3 \times 10^{18}$ cm$^{-3}$ to still get a good working transistor.

c) The base-collector leakage current must not exceed a certain limit. Suppose that in a given technology, the area density of the collector-base leakage current with the biasing near the breakdown voltage $V_b$ is $J_o$=50 pA/cm$^2$. Since $I_{co}=J_o*A_c$, this and equation (1) impose $$A_c < 3*10^{-6} cm^2 \quad (6),$$

and the equivalent junction diameter $D_c$ should be $$D_c < 20 \mu m \quad (7).$$

Therefore the base-collector junction should be designed as small as technologically feasible. This reduces the parasitic pulse rate by minimizing the volume in which undesired generation of charge carriers occurs. For the contemporary 0.35 µm CMOS technology, a reasonable size criterion is $$D_c < 10 \mu m \quad (8).$$

While the exemplary values for the quantities $I_{co}$, $\tau$, $C_c$ and $D_c$ defined in and calculated according to equations 1, 2, 4 and 8 are preferred values, the novel semiconductor device will for many applications work if the leakage current $I_{co}$ of the collector-base junction (which is designated as the first PN junction) is smaller than $10^{-15}$ A which can be achieved if the area of the base-collector junction as measured inside the guard ring does not exceed $10^{-5}$ cm$^2$ which corresponds to about $D_c$=30 µm. However, from the above it follows that the smaller the bipolar transistor is the better it works.

In order to minimize the leakage current of the collector-base junction, the base when seen from top in plan view is preferably formed as a circle or disc thus avoiding corners.

Apart from the specific features described above, the bipolar transistor 5 should have some other features which are also useful for a conventional bipolar transistor. These include:
a) a high emitter injection efficiency, i.e., a high proportion of the emitter current should reach the neutral base region as minority carrier flow. A high injection efficiency of the emitter E can be achieved by using a heavily-doped emitter, by using an emitter made of a semiconductor material having a wider band gap than the semiconductor material constituting the base, or by making use of a polysilicon emitter;
b) a high base transport factor, i.e., a high proportion of the charge carriers that enter the base region at the emitter-base junction should reach the collector multiplication region. For achieving a high base transport factor, the base region should be narrow, but not so narrow as to allow punch-through breakdown between the collector and the emitter when biased for Geiger mode operation; and
c) the bipolar transistor should be made of a semiconductor material having a high life-time for the minority carriers.

Since the emitter efficiency at low currents increases with the current density, it is very useful to minimize the size of the emitter area of the bipolar transistor 5 to the limits of the technology.

The criteria about the maximal effective diameter of the base-collector junction and the importance of minimizing the area of the emitter-base junction can be summarized into the following design guideline: the bipolar transistor 5 should occupy an area as small as technologically feasible. This applies to all features, including the collector-base junction, the emitter-base junction, and all contact areas, namely those of emitter E, base B and collector C.

The emitter efficiency of the bipolar transistor 5 at very low current levels can be further improved by minimizing the surface recombination rate at the periphery of the emitter-base junction. This can be achieved by placing a properly-polarized field plate over the part of the emitter-base junction that touches the surface. The field plate can be merged with the metallic contact of the emitter. In this case, the emitter metal contact will also cover the periphery of the emitter-base junction.

In addition to the discussed and shown examples, many others can be designed. In particular, PNP structures can also be used, and lateral bipolar transistors can also be optimized to operate in the Geiger mode above the breakdown voltage. The choice between a PNP and an NPN structure depends on the ionization coefficients for holes and electrons in the semiconductor material used. It is also influenced by the availability of adequate layers in the selected manufacturing technology. At the present state of the art in semiconductor industry, it is preferable to realize the bipolar transistor 5 as an NPN structure.

FIGS. 6 to 8 show different embodiments of the bipolar transistor 5 of the semiconductor device according to the invention. FIG. 6 shows a cross-section of the bipolar transistor 5 that is realized as an NPN structure in a p-doped substrate 12 of Silicon semiconductor material, i.e., as a structure comprising semiconductor material of a first conductivity type and a second complementary conductivity type. The collector C is an n-well 13 formed in the p-type substrate 12, the base B is a p-well 14 formed in the n-well 13 and the emitter E is a heavily n-doped region formed like a contact. The base B and the collector C comprise heavily doped contact regions. A first PN junction, the collector-base junction, is formed along the interface between the collector C and the base B. A second PN junction, the emitter-base junction, is formed along the interface between the emitter E and the base B. Optionally, a buried heavily doped n+ layer 15 is placed below the emitter E in the n-well 13 in order to increase the electrical field in the collector-base junction. The limits of the area of the depletion region 16 of the first PN junction which is formed when operating the collector-base junction in the Geiger mode above its breakdown voltage are illustrated with dashed lines. The surface of the semiconductor material is covered by an insulating layer 17 (in CMOS technology made of silicon dioxide) and the base B, the emitter E and the collector C are contacted by conventional metal lines 18. The maximum of the electrical field in the collector-base junction occurs in the area 19.

FIG. 7 shows the cross-section of another bipolar transistor 5 that is realized as an NPN structure in a p-doped Silicon substrate 12. The p-well 14 is surrounded by a circular guard ring 20 formed by a less doped but deeper p-layer. A field plate 21 is placed above the base-collector junction in the area where its depletion region touches the surface in order to prevent premature surface breakdown. The field plate 21 is properly biased to achieve this effect.

FIG. 8 shows the cross-section of yet another bipolar transistor 5. The collector C is formed as a deep n-well 13 in a p-doped Silicon substrate 12. The base B is formed as a p-well 14 in the n-well 13 that is surrounded by a deep p-type guard ring 20. The emitter E is an epitaxially grown n-type emitter made of a semiconductor material having a wider band gap than the substrate semiconductor material. Alternatively, the emitter E comprises a highly doped polysilicon layer.

With the embodiments shown in FIGS. 6 to 8 the surface area of the p-well 14 should not exceed $10^{-5}$ cm$^2$, and the above mentioned design rules for the first PN junction are fulfilled, namely the maximum of the electrical field in the first PN junction is located in the bulk of the semiconductor, is constant over a substantial part of the PN junction and is at least 10% greater than the electrical field at the periphery, i.e., at the interface between the semiconductor and the insulating layer 17 of the PN junction. Furthermore, the above mentioned design rules for the bipolar transistor are fulfilled too, namely the area of the second PN junction is smaller than the area of the first PN junction area, the depletion regions of the first and second PN junction do not touch each other, the maximum of the electrical field in the first PN junction is uniform, occurs at a constant distance of the second PN junction and is located very close to the second PN junction.

Instead of using the guard ring 20 having the same conductivity type as the base B of the bipolar transistor 5 and a reduced doping concentration compared to the doping concentration of the base B it is alternatively possible to form the collector C such that its doping concentration in the region of the edges of the well forming the base B is reduced. A method for making a collector C with these properties is described in European Patent No. EP 1191598.

The semiconductor device of the invention is well suited for application in an A/D converter. An A/D convertor can be built by connecting a digital counter to the output terminal 4 of the device. Preferably, this digital counter is integrated on the same semiconductor chip. The state of the counter after a given time period represents the number of pulses delivered by the device 5 over this time, which is proportional to the input current $I_{in}$. The salient feature of such an A/D converter is its unprecedented combination of high conversion speed and low power. The high conversion speed is the result of the avalanche process and the operation in the Geiger mode. The minimum time needed per bit corresponds to the recharging time constant τ which can be made as short as a few nanoseconds. The theoretical limit of the energy E needed per bit of information, i.e., per electron detected, is given by the energy spent for recharging the capacitances $C_c+C_p$ (FIG. 1). The energy E is given by $$E = \tfrac{1}{2}(V_{cc}^2 - V_b^2)*(C_c+C_p) \quad (9).$$

For example, $V_b$=20 V, $V_{cc}$=25 V and $C_c+C_p$=10 fF yield E≅1.1 pJ.

Figure 9:
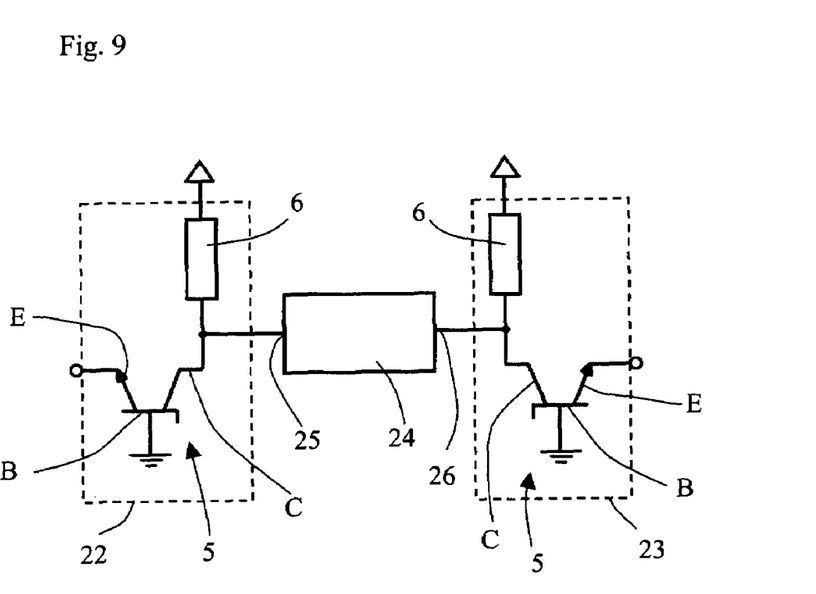
FIG. 9 is an electrical schematic drawing showing an application of a semiconductor device according to an embodiment of the present invention for measuring a difference between two small currents or voltages.

FIG. 9 shows the application of an embodiment of the invention for the measurement of the difference between two small currents or two small voltages. The measurement circuit comprises a first semiconductor device 22 according to an embodiment of the invention to the input terminal of which the first current or first voltage is applied, a second semiconductor device 23 according to an embodiment of the invention to the input terminal of which the second current or second voltage is applied and an up/down counter 24 having an up counting input terminal 25 and a down counting input terminal 26. The collector C of the bipolar transistor of the first semiconductor device 22 is connected to the up counting input terminal 25. The collector C of the bipolar transistor of the second semiconductor device 23 is connected to the down counting input terminal 26. The up counting input terminal 25 and the down counting input terminal 26 have a high input impedance. The up/down counter 24 delivers a digital value in the form of a predetermined number of bits. The two semiconductor devices 22 and 23 and the up/down counter 24 are preferably integrated side by side on a single semiconductor chip. The measurement circuit works as follows: At the beginning of a measurement cycle the up/down counter 24 is reset to the middle of its counting range. Each avalanche current pulse created by an electron in the first semiconductor device 22 produces a voltage pulse that increments the up/down counter 24 and each avalanche current created by an electron in the second semiconductor device 23 produces a voltage pulse that decrements the up/down counter 24. If currents are applied to the input terminals then the digital value at the output of the up/down counter 24 after a given period of time is proportional to the difference of the applied currents. If voltages are applied to the input terminals then the digital value at the output of the up/down counter 24 after a given period of time is related to the difference of the applied voltages. Instead of a second device 5, the down counting input terminal 26 may be connected to any other pulse-supplying device, such as an oscillator. In this case, the up-down counter will deliver the digital representation of the difference of the input current of the first device 5 and a reference value supplied by the other pulse-supplying device.

The semiconductor device of embodiments of the present invention is also well suited for the implementation in circuits processing asynchronous pulses, such as neural networks.

The semiconductor device of embodiments of the present invention can be used in many ways as a random number generator to produce a sequence of random numbers at a high rate. It is based on the fact that the avalanche pulses are triggered by single electrons. The time at which an electron will be injected into the emitter of the bipolar transistor is random. The voltage applied to the emitter only changes the likelihood for an electron to be injected into the device and the base-collector voltage only determines the avalanche probability. A first way of using the device of the present invention as a random number generator would be to compare the time interval between successive avalanche pulses. A second way would be to generate random numbers by counting the number of avalanche pulses occurring within a given time period, followed, if necessary, by an un-biasing algorithm. A third way would be to combine several devices sharing the same input (emitter) potential and use the information about the localization of the detected electron, i.e., to determine which device fired first.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

The invention claimed is:

1. A semiconductor device for measuring ultra low currents or voltages, comprising:
    a first and a second voltage supply terminal,
    an input terminal for receiving an electrical current or being supplied with a voltage to be measured,
    a bipolar transistor having a base, an emitter and a collector, wherein a first PN junction is formed between the base and the collector and a second PN junction is formed between the base and the emitter, wherein the emitter is coupled to the input terminal and the base is coupled to the second voltage supply terminal, wherein the first PN junction is designed for reverse biased operation as an avalanche diode and wherein a leakage current of the first PN junction is smaller than $10^{-15}$ A,
    and a quenching and recharging circuit having a first terminal coupled to the first voltage supply terminal and a second terminal coupled to the collector of the bipolar transistor, the quenching and recharging circuit permitting operation of the first PN junction reverse biased above the breakdown voltage of the first PN junction.

2. The semiconductor device of claim 1, wherein the area of the second PN junction is smaller than the area of the first PN junction.

3. The semiconductor device of claim 2, wherein the base includes a well of a first conductivity type embedded in a region of a second conductivity type wherein the region of the second conductivity type has a reduced dopant concentration in a region near the edges of the well of the first conductivity type.

4. The semiconductor device of claim 3, further comprising:
  a buffer having an input with a high input impedance, wherein the collector of the bipolar transistor is coupled directly or via a coupling capacitor to the input of the buffer.

5. The semiconductor device of claim 3, wherein the breakdown voltage of the first PN junction is more than 15 volts.

6. The semiconductor device of claim 3, wherein a surface area of the well of the first conductivity type is smaller than $10^{-5}$ cm$^2$.

7. The semiconductor device of claim 2, further comprising:
  a buffer having an input with a high input impedance, wherein the collector of the bipolar transistor is coupled directly or via a coupling capacitor to the input of the buffer.

8. The semiconductor device of claim 2, wherein the breakdown voltage of the first PN junction is more than 15 volts.

9. The semiconductor device of claim 2, wherein a surface area of the well of the first conductivity type is smaller than $10^{-5}$ cm$^2$.

10. The semiconductor device according of claim 1 wherein the base consists of a well of a first conductivity type bordered by a guard ring of the first conductivity type embedded in an area of a second conductivity type.

11. The semiconductor device of claim 10, further comprising:
  a buffer having an input with a high input impedance, wherein the collector of the bipolar transistor is coupled directly or via a coupling capacitor to the input of the buffer.

12. The semiconductor device of claim 10, wherein the breakdown voltage of the first PN junction is more than 15 volts.

13. The semiconductor device of claim 10, wherein a surface area of the well of the first conductivity type is smaller than $10^{-5}$ cm$^2$.

14. The semiconductor device of claim 1 wherein the base includes a well of a first conductivity type embedded in an area of a second conductivity type wherein the region of the second conductivity type has a reduced dopant concentration in a region near the edges of the well of the first conductivity type.

15. The semiconductor device of claim 14, further comprising:
  a buffer having an input with a high input impedance, wherein the collector of the bipolar transistor is coupled directly or via a coupling capacitor to the input of the buffer.

16. The semiconductor device of claim 14, wherein the breakdown voltage of the first PN junction is more than 15 volts.

17. The semiconductor device of claim 14, wherein a surface area of the well of the first conductivity type is smaller than $10^{-5}$ cm$^2$.

18. The semiconductor device of claims 1, wherein the base includes a well of a first conductivity type bordered by a guard ring of the first conductivity type embedded in a region of a second conductivity type.

19. The semiconductor device of claim 18, further comprising:
  a buffer having an input with a high input impedance, wherein the collector of the bipolar transistor is coupled directly or via a coupling capacitor to the input of the buffer.

20. The semiconductor device of claim 18, wherein the breakdown voltage of the first PN junction is more than 15 volts.

21. The semiconductor device of claim 18, wherein a surface area of the well of the first conductivity type is smaller than $10^{-5}$ cm$^2$.

22. The semiconductor device of claim 1, wherein a periphery of the emitter-base junction is covered by a metal layer.

23. The semiconductor device of claim 1, further comprising:
  a buffer having an input with a high input impedance, wherein the collector of the bipolar transistor is coupled directly or via a coupling capacitor to the input of the buffer.

24. The semiconductor device of claim 1, wherein the breakdown voltage of the first PN junction is more than 15 volts.

25. The semiconductor device of claim 1, wherein a surface area of the well of the first conductivity type is smaller than $10^{-5}$ cm$^2$.

26. A method for operating a semiconductor device to measure a signal comprising ultra-small electrical current or small voltage, the semiconductor device comprising:
  a first and a second voltage supply terminal;
  an input terminal for receiving an electrical current or being supplied with a voltage to be measured;
  a bipolar transistor having a base, an emitter and a collector, wherein a first PN junction is formed between the base and the collector and a second PN junction is formed between the base and the emitter, wherein the emitter is coupled to the input terminal and the base is coupled to the second voltage supply terminal, and wherein the first PN junction is designed for reverse biased operation as an avalanche diode and wherein a leakage current of the first PN junction is less than $10^{-15}$ A; and
  a quenching and recharging circuit having a first terminal coupled to the first voltage supply terminal and a second terminal coupled to the collector of the bipolar transistor, the quenching and recharging circuit configured to permit operation of the first PN junction reverse biased above a breakdown voltage of the first PN junction,
  the method comprising
    applying a first, constant voltage to the first voltage supply terminal; and
    applying a second, constant voltage to the second voltage supply terminal, wherein a voltage difference between the first voltage and the second voltage is more than the breakdown voltage of the first PN junction.

27. The method of claim 26, further comprising:
applying the signal to the emitter of the bipolar transistor of the semiconductor device for converting the signal into a series of pulses.

28. The method of claim 27, further comprising:
applying the series of pulses to a digital counter.

* * * * *